United States Patent
Akiyama

(10) Patent No.: US 7,889,773 B2
(45) Date of Patent: Feb. 15, 2011

(54) SEMICONDUCTOR DEVICE

(75) Inventor: Suguru Akiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 188 days.

(21) Appl. No.: 12/267,093

(22) Filed: Nov. 7, 2008

(65) Prior Publication Data

US 2009/0067462 A1   Mar. 12, 2009

Related U.S. Application Data

(63) Continuation of application No. PCT/JP2006/309585, filed on May 12, 2006.

(51) Int. Cl.
*H01S 5/00* (2006.01)

(52) U.S. Cl. .............. 372/43.01; 372/44.01; 372/45.01; 257/14

(58) Field of Classification Search .............. 372/43.01, 372/44.01, 45.01
See application file for complete search history.

(56) References Cited

U.S. PATENT DOCUMENTS

| 6,618,411 | B1 * | 9/2003 | Takiguchi et al. | ......... | 372/45.01 |
| 2007/0183470 | A1 * | 8/2007 | Nakabayashi | ............ | 372/46.01 |
| 2008/0315182 | A1 * | 12/2008 | Takada et al. | ................. | 257/14 |

FOREIGN PATENT DOCUMENTS

| JP | 3-231220 A | 10/1991 |
| JP | 9-171162 A | 6/1997 |

(Continued)

OTHER PUBLICATIONS

B. Chen et al, "A Novel 1.3-um High To AlGaIn/InP Strained-Compensated Multi-Quantum Well Complex-Coupled Distributed Feedback Laser Diode", Jpn. J. Appl. Phys., Sep. 1999, pp. 5096-5100, vol. 38, Part 1, No. 9A, Cited in ISR.

(Continued)

*Primary Examiner*—Dung T Nguyen
(74) *Attorney, Agent, or Firm*—Westerman, Hattori, Daniels & Adrian, LLP

(57) ABSTRACT

A semiconductor device includes an InP substrate, an AlGaInAs-based first layer, an AlGaInAs-based second layer, an InGaAsP-based third layer, and an InGaAsP-based fourth layer. The first and second layers have compositions which are same or substantially same as each other on an interface therebetween. The composition of the layer varies such that a band gap continuously increases from the first layer side toward the third layer side. The compositions of the second and third layers are set such that energy levels of a valence band maximum are substantially equal to each other on an interface between the second and third layers. The composition of the third layer varies such that a band gap continuously increases from the second layer side toward the fourth layer side. The compositions of the third and fourth layers are same or substantially same as each other on an interface between the third and fourth layers.

19 Claims, 9 Drawing Sheets

FOREIGN PATENT DOCUMENTS

| | | |
|---|---|---|
| JP | 11-261154 A | 9/1999 |
| JP | 11-354865 A | 12/1999 |
| JP | 2002-9400 A | 1/2002 |
| JP | 2004-341092 A | 12/2004 |

OTHER PUBLICATIONS

P. H. Lei et al., "Effect of InGaAsP Intermediate Layer in 1.3um AlGaInAs Strain-compensated Multiple Quantum Well Laser Diodes", IEE Proceedings Optoelectronics, Dec. 2003, pp. 541-544, vol. 150, No. 6, Cited in ISR.

N. C. Frateschi et al., "High Performance Uncooled C-band, 10 Gbit/s InGaAlAs MQW Electroabsorption Modulator Integrated to Semiconductor Amplifier in Laser-integrated Modules", Electronics Letters, Jan. 22, 2004, vol. 40, No. 2.

International Search Report of PCT/JP2006/309585, Mailing Date of Jun. 13, 2006.

* cited by examiner

SEMICONDUCTOR DEVICE

CROSS REFERENCE TO RELATED APPLICATION(S)

This application is based upon and claims priority to PCT Application PCT/JP2006/309585 filed on May 12, 2006, the entire contents of which are incorporated herein by reference.

TECHNICAL FIELD

The embodiments discussed herein are directed to a semiconductor device.

BACKGROUND

A conventional electro-absorption modulator is configured, for example, as illustrated in a schematic sectional view of FIG. 5, as a modulator having a modulator structure formed on an n-type InP substrate 100 and made from a material substantially lattice matching with the InP substrate.

In particular, as illustrated in FIG. 5, the conventional electro-absorption modulator is structured such that an n-type InP cladding layer 101, an n-side optical guide layer (SCH layer) 102, an undoped multiple quantum well (MQW) active layer 103, a p-side optical guide layer (SCH layer) 104, a p-type InP cladding layer 105 are stacked in order on the n-type InP substrate 100 to form a mesa structure and the mesa structure is buried in a high-resistance InP burying layer 106. Further, a p-side electrode 107 is formed on the upper face of the p-type InP cladding layer 105 and an n-side electrode 108 is formed on the back face of the n-type InP substrate 100. Further, a reverse bias electric field is applied to the MQW active layer 103 by the upper and lower electrodes 107 and 108 to vary the absorption coefficient for light propagating in the MQW active layer 103 thereby to modulate (intensity modulate) the intensity of the light.

Here, an InGaAsP-based material is conventionally used for the MQW active layer 103 and also for the SCH layers 102 and 104 which sandwich the MQW active layer 103 from below and above.

In this instance, the energy band diagram along a broken line A-A in FIG. 5 is such as illustrated in FIG. 6. In particular, as seen in FIG. 6, the energy band gap is the smallest in a well layer of the MQW active layer 103 and successively increases in order of a barrier layer of the MQW active layer 103, the n-side and p-side SCH layers 102 and 104, and the n-type and p-type InP cladding layers 101 and 105.

Particularly, in the n-side and p-side SCH layers 102 and 104, the energy band gap varies, as seen in FIG. 6, so as to gradually increase from the side on which the layers 102 and 104 contact with the MQW active layer 103 (barrier layer) toward the side on which the layers 102 and 104 contact with the n-type and p-type InP cladding layers 101 and 105, respectively. Such variation of the energy band gap as just described can be implemented by changing the composition of InGaAsP while a lattice matching condition with the InP substrate is satisfied.

By introducing such a graded layer whose composition continuously varies in this manner into the SCH layers (SCH graded layers), the energy level continuously varies on both of the p side and the n side such that the MQW active layer 103 whose energy band gap is small and the InP cladding layers 101 and 105 whose energy band gaps are large are smoothly connected to each other on the energy band diagram. In short, as a structure for connecting layers having energy band gaps different from each other, the structure is implemented which eliminates the discontinuity (band discontinuity, band offset) of the energy level between the conduction band and the valence band.

Incidentally, in recent years, it is studied to use an AlGaInAs-based material which is one of materials which lattice match with an InP substrate as a material for an MQW active layer similarly to an InGaAsP-based material.

This is because, different from an InGaAsP-based material, an AlGaInAs-based material can improve a device performance (for example, an extinction ratio, a temperature characteristic or the like) of an electro-absorption modulator arising from the fact that, where a layer of a composition having a large band gap and another layer of another composition having a small band gap are connected to each other, the band offset of the conduction band and the band offset of the valence band are different from each other.

Also it is studied to use, where an InGaAsP-based SCH graded layer and an AlGaInAs-based MQW active layer which are made from materials different from each other are connected to each other, in order to eliminate the band discontinuity appearing on the interface between the layers, an AlGaInAs-based material same as that of the MQW active layer for the p-side SCH graded layer.

SUMMARY

According to an aspect of the embodiment, a semiconductor device includes an InP substrate, a first semiconductor layer made from $Al_{x1}Ga_{y1}In_{1-x1-y1}As$ where $0 \leq x1 \leq 1$ and $0 \leq y1 \leq 1$, a second semiconductor layer made from $Al_{x2}Ga_{y2}In_{1-x2-y2}As$ where $0 \leq x2 \leq 1$ and $0 \leq y2 \leq 1$, a third semiconductor layer made from $In_{x3}Ga_{1-x3}As_{y3}P_{1-y3}$ where $0 \leq x3 \leq 1$ and $0 \leq y3 \leq 1$, and a fourth semiconductor layer made from $In_{x4}Ga_{1-x4}As_{y4}P_{1-y4}$ where $0 \leq x4 \leq 1$ and $0 \leq y4 \leq 1$), and wherein the first, second, third and fourth semiconductor layers are provided in order in a contacting relationship with each other over the InP substrate. Particularly, the first and second semiconductor layers have compositions which are same as or substantially same as each other on an interface therebetween. Further, the composition of the second semiconductor layer continuously varies such that a band gap continuously increases from the first semiconductor layer side toward the third semiconductor layer side. Furthermore, the compositions of the second and third semiconductor layers are set such that energy levels of a valence band maximum are equal to or substantially equal to each other on an interface between the second and third semiconductor layers. Still further, the composition of the third semiconductor layer continuously varies such that a band gap continuously increases from the second semiconductor layer side toward the fourth semiconductor layer side. Yet further, the compositions of the third and fourth semiconductor layers are same as each other on an interface between the third and fourth layers.

Additional objects and advantages of the embodiment will be set forth in part in the description which follows, and in part will be obvious from the description, or may be learned by practice of the embodiment. The object and advantages of the embodiment will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF THE EMBODIMENTS

Figure 1:
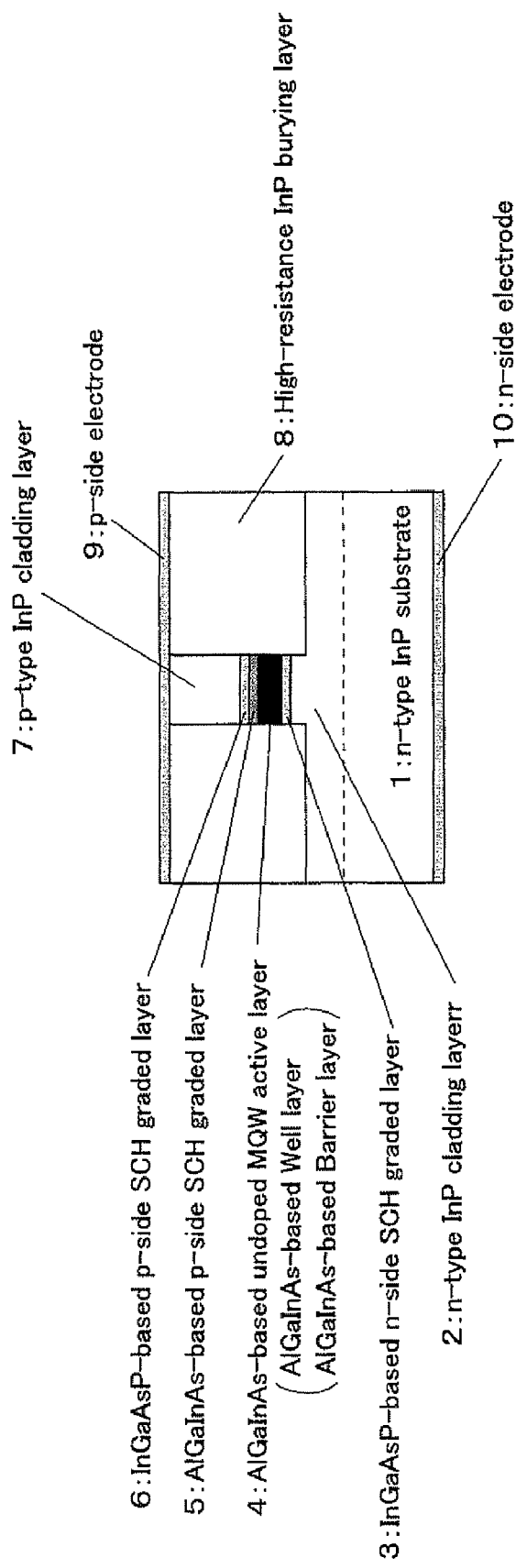
FIG. 1 is a schematic sectional view illustrating a configuration of a semiconductor device according to a first embodiment.

As described above, it is significant to eliminate band discontinuity on an energy band diagram as described above in order to implement high-speed high-optical inputting operation in an electro-absorption modulator.

In particular, if band discontinuity occurs, then when holes and electrons (carriers) generated by absorption of light into an MQW active layer move to a p-side electrode and an n-side electrode, respectively, the high-speed movement thereof is blocked. Further, the carriers whose movement is blocked by the band discontinuity are accumulated at the band discontinuity portion and vary the electric field to be applied to the MQW active layer. As a result, the high-speed response characteristic of the modulator degrades. Accordingly, elimination of the band discontinuity is significant in order to implement high-speed high-optical inputting operation in an electro-absorption modulator thereby to prevent degradation of the high-speed response characteristic.

Particularly, a subject caused by such band discontinuity as described above is remarkable on the p side on which holes move rather than on the n side on which electrons move. Therefore, it is significant to eliminate the band discontinuity in the p-side layer structure of the MQW active layer.

On the other hand, if an AlGaInAs-based material whose band offset ratio (ratio between the band offset value of the conduction band and the band offset value of the valence band) is different in comparison with an InGaAsP-based material is used for the MQW active layer, then the band offset value $\Delta Ec$ of the conduction band is relatively higher than the band offset value $\Delta Ev$ of the valence band in the band offset between the well layer and the barrier layer in the MQW active layer. Therefore, performance enhancement of the modulator is expected.

However, where an AlGaInAs-based MQW active layer is connected to a p-side InP cladding layer through a p-side SCH graded layer made from an InGaAsP-based material or an AlGaInAs-based material, band discontinuity occurs with some interface between the layers, and as a result, an energy barrier may appear in the valence band and/or a potential well may appear in the conduction band. The phenomenon just described is a problem unique to a case wherein layers made from two material types which exhibit different variations of the energy position Ev of the valence band maximum and the energy position Ec of the conduction band minimum with respect to the band gap Eg from each other are connected to each other.

As a result, holes and electrons (carriers) generated by absorption of light into the MQW active layer are blocked from moving at a high speed to the p-side electrode and the n-side electrode, respectively, and high-speed operation of the modulator cannot be attained.

The problem is described in detail below.

First, it is described in detail that the ratio (band offset ratio) between the band offset of the conduction band and the band offset of the valence band differs depending upon the material.

Figure 7:
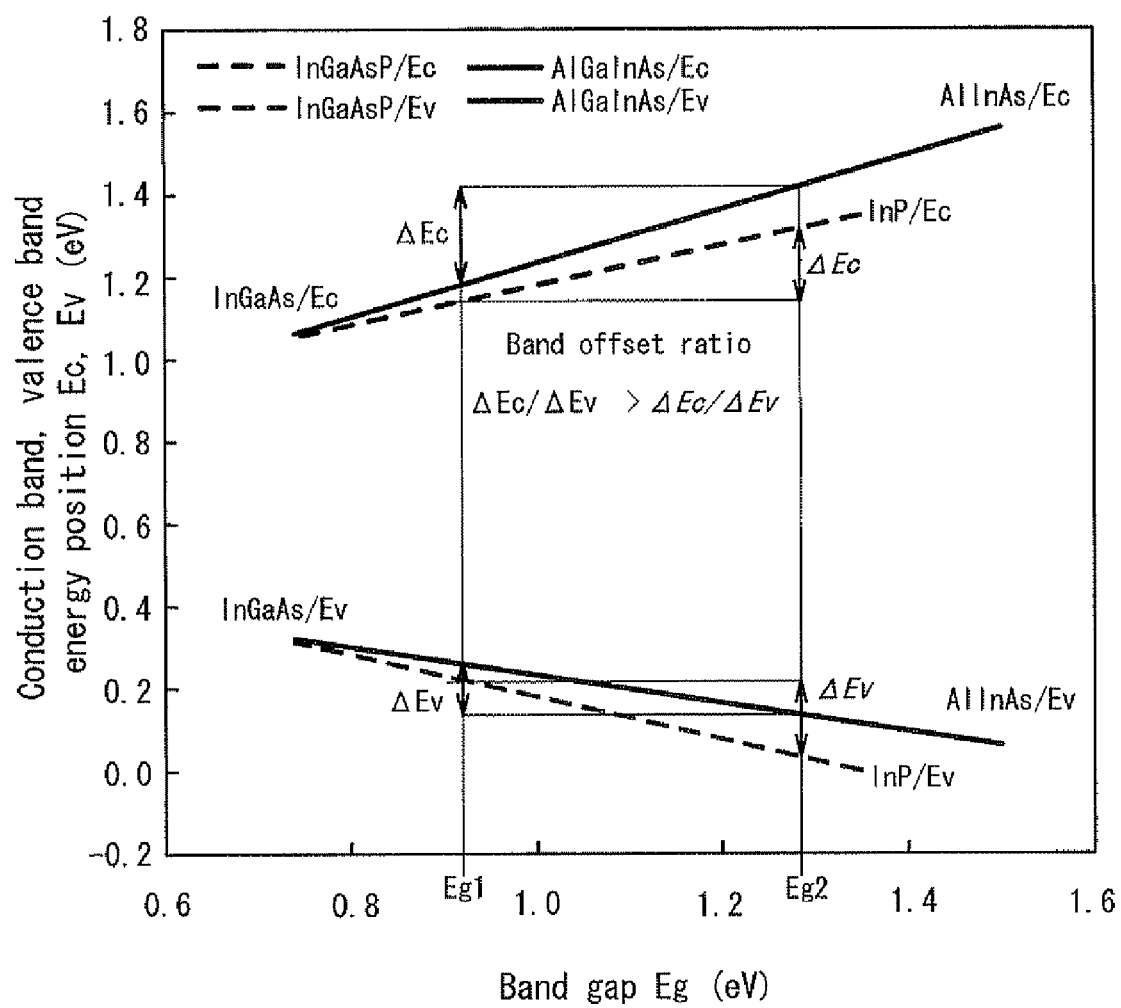
FIG. 7 is a diagram illustrating variation of the energy position Ec of the conduction band minimum and the energy position Ev of the valence band maximum of an InGaAsP-based material and an AlGaInAs-based material with respect to the band gap Eg.

FIG. 7 is a view illustrating in what manner the energy position Ec of the conduction band minimum and the energy position Ev of the valence band maximum vary with respect to the band gap Eg where the compositions of an InGaAsP-based material and an AlGaInAs-based material are varied to vary the band gap Eg. It is to be noted here that the energy position of the valence band of InP is used as the reference.

It can be recognized from FIG. 7 that the manner of the variation of the energy position Ec of the conduction band minimum and the energy position Ev of the valence band maximum is different between the two material types. In particular, it is recognized that, while it is common in both of the material systems that the composition with which the band gap is smallest is InGaAs, where the composition is varied so as to increase the band gap Eg, the ratio (inclination) of the variation of the energy position Ec of the conduction band minimum and the energy position Ev of the valence band maximum with respect to the band gap Eg differs between the two material systems.

As a result, it is recognized that, where the InGaAsP-based material and the AlGaInAs-based material are compared with each other with the same band gap Eg, the energy position Ec of the conduction band minimum and the energy position Ev of the valence band maximum of the AlGaInAs-based material are normally higher than the energy position Ec of the conduction band minimum and the energy position Ev of the valence band maximum of the InGaAsP-based material and the energy positions Ec and Ev do not coincide between the two material systems as seen in FIG. 7. In particular, it is recognized that it is impossible to make both of the energy position Ec of the conduction band minimum and the energy position Ev of the valence band maximum coincide with each other at the same time between the two material systems except for InGaAs in whatever way the band gap Eg is selected with regard to both of the material systems.

Further, it is recognized that, where a layer of a composition (Eg1) having a small band gap and another layer of another composition (Eg2) having a large band gap as seen in FIG. 7 are selected in the individual material systems and the layers are connected to each other, while discontinuity of the energy level, that is, band offset, (the band offset values of the conduction band and the valence band are represented by $\Delta Ec$ and $\Delta Ev$, respectively) appears in both of the material systems, the band offset values $\Delta Ec$ and $\Delta Ev$ differ between the two material systems.

In particular, it is recognized that, where the two material systems are compared with each other, while the value ($\Delta Ec + \Delta Ev$) calculated by adding the band offset value $\Delta Ec$ of the conduction band and the band offset value $\Delta Ev$ of the valence band is equal between the two material systems and coincides with the difference $\Delta Eg$ ($\Delta Eg = Eg2 - Eg1$) between the band gaps of the layers, the ratio ($\Delta Ec/\Delta Ev$; band offset ratio) between the band offset value $\Delta Ec$ of the conduction band and the band offset value ΔEv of the valence band is greater with the AlGaInAs-based material than with the InGaAsP-based material.

On the other hand, while such band offsets (ΔEc, ΔEv) as described above appear between a well layer and a barrier layer in an MQW active layer used for a semiconductor laser, an electro-absorption modulator or the like, where the differences ΔEg between the band gaps of the layers are same as or substantially same as each other, it is considered advantageous to use a material with which the band offset value ΔEc of the conduction band can be made relatively great in comparison with the band offset value ΔEv of the valence band in order to obtain a good device characteristic. In this regard, since the AlGaInAs-based material is more advantageous as described above, it is studied to introduce the AlGaInAs-based material as a material of the MQW active layer.

Figure 8:
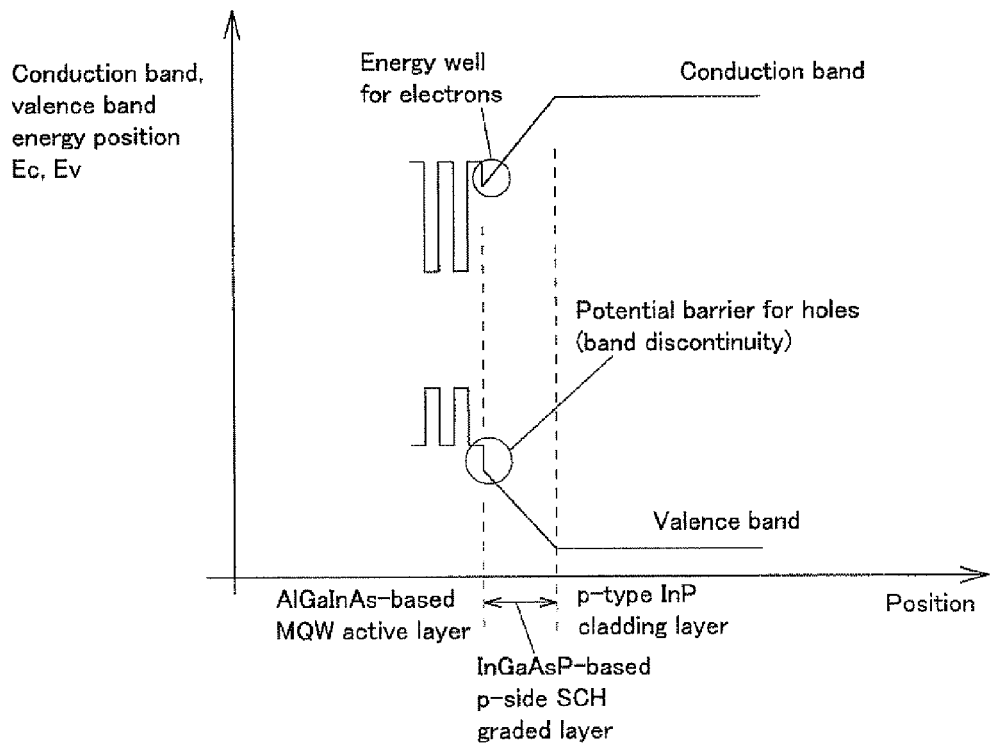
FIGS. 8 and 9 are energy band diagrams illustrating subjects to be solved by the embodiment.

Here, FIG. 8 illustrates an energy band diagram of an electro-absorption modulator having an MQW active layer formed on an InP substrate and made from an AlGaInAs-based material. It is to be noted that only a portion from an MQW active layer to a p-type InP cladding layer is illustrated in FIG. 8.

Figure 5:
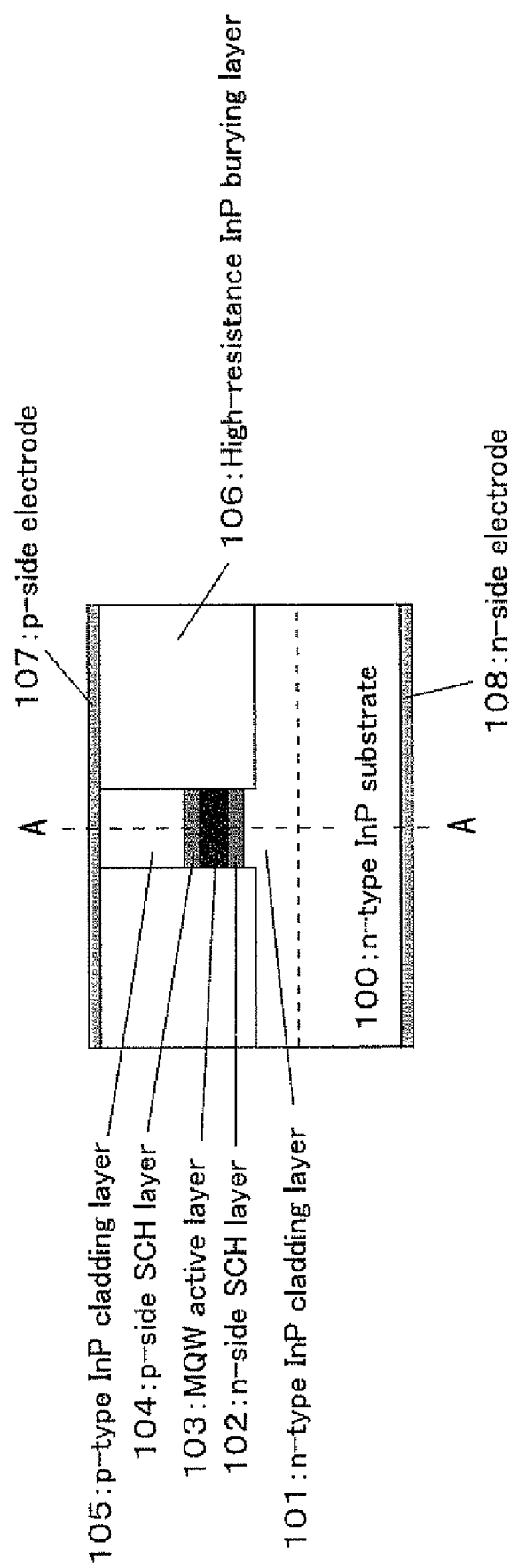
FIG. 5 is a schematic sectional view illustrating a configuration of a conventional electro-absorption type modulator.
Figure 6:
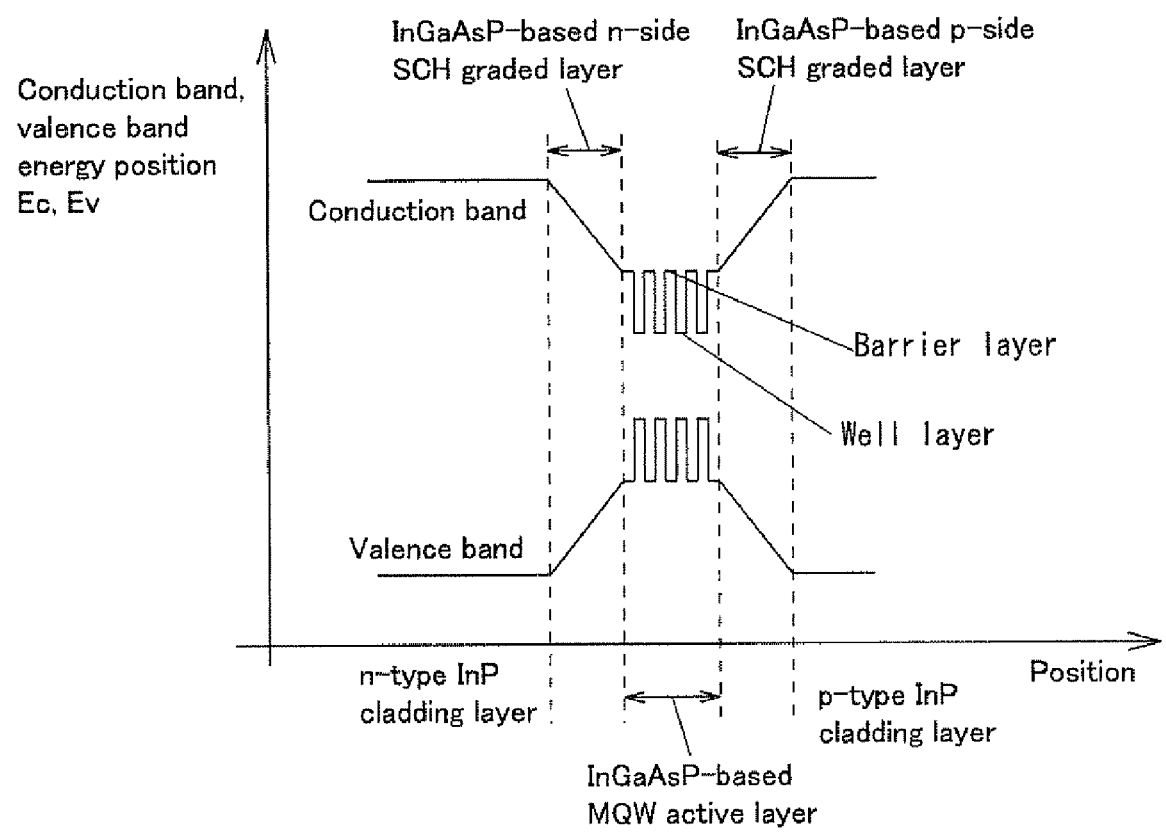
FIG. 6 is an energy band diagram of the conventional electro-absorption type modulator.

It is to be noted that the electro-absorption modulator having the energy band diagram illustrated in FIG. 8 has a structure same as the structure (refer to FIG. 5) of the modulator described above except the material of the MQW active layer. A p-side optical guide layer (SCH layer; graded layer) and a p-type InP cladding layer made from an InGaAsP-based material are provided on the p side of the MQW active layer, as illustrated in FIG. 8. Also the band gaps Eg of the well layer and the barrier layer of the MQW active layer are same as those of the electro-absorption modulator (refer to FIG. 6) described above.

Here, since an AlGaInAs-based material is used for the MQW active layer, if notice is taken of a band offset generated between the well layer and barrier layer of the MQW active layer, particularly of the ratio (ΔEc/ΔEv) between the band offset value ΔEc of the conduction band and the band offset value ΔEv of the valence band as seen in FIG. 8, then the band offset ratio (ΔEc/ΔEv) is greater than that in the alternative case (refer to FIG. 6) wherein an InGaAsP-based material is used for the MQW active layer described above as seen in FIG. 8.

On the other hand, if notice is taken of the boundary between the barrier layer positioned on the most p side of the MQW active layer and the p-side SCH graded layer, it is recognized that, while band discontinuity does not appear on the boundary in the case (refer to FIG. 6) wherein an InGaAsP-based material is used for the MQW active layer described above, band discontinuity (band offset) appears on both of the conduction band and the valence band where an AlGaInAs-based material is used for the MQW active layer as seen in FIG. 8.

This arises from the fact that, as can be recognized from FIG. 7, even if the band gaps Eg are set equal between the AlGaInAs-based barrier layer and the InGaAsP-based SCH graded layer of the MQW active layer, the energy positions Ec and Ev of the conduction band and the valence band become different.

Where an AlGaInAs-based material is used for the MQW active layer in this manner, band discontinuity appears because it is necessary to connect the InGaAsP-based material and the AlGaInAs-based material, that is, the material systems different from each other. In particular, since a InGaAsP-based material is used for the MQW active layer (refer to FIG. 6) as in a conventional manner, all of the MQW active layer, p-side SCH graded layer and p-type InP cladding layer are made from the same InGaAsP-based material, such a subject as described above does not appear. However, if it is tried to use an AlGaInAs-based material for the MQW active layer, then it becomes necessary to connect the InGaAsP-based material and the AlGaInAs-based material, that is, of the material systems different from each other, and this gives rise to a new subject that band discontinuity appears.

As described above, if band discontinuity appears on the conduction band and the valence band, then they make an obstacle to implementation of high-speed operation of the modulator.

Particularly, the band discontinuity on the valence band acts as an energy barrier to holes generated by absorption of light into the MQW active layer and the holes are accumulated around the energy barrier, and as a result, the high-speed response characteristic of the modulator is degraded.

Further, also on the conduction band, the energy position Ec on the side of the p-side SCH graded layer on which it contacts with the barrier layer of the MQW active layer is lower than that in the barrier layer of the MQW active layer as seen in FIG. 8, and a potential well for electrons is formed at this portion. The electrons of the carriers generated by absorption of light into the MQW active layers preferably reach the n-side electrode quickly through the n-side SCH layer and the n-type InP cladding layer. However, if a potential well for electrons is formed in the p-side SCH graded layer in this manner, then the electrons generated in the MQW active layer are trapped in the portion described. As a result, the electrons cannot be moved at a high speed to the n-side electrode on the opposite side, and this makes a problem when it is tried to implement high-speed operation of the modulator.

Incidentally, it seems a possible idea to set, in order to eliminate such band discontinuity on the p-side valence band as described above, the band gap on the side of the p-side SCH graded layer made from an InGaAsP-based material on whose side it contacts with the barrier layer of the MQW active layer so as to be smaller than that in the case (refer to FIG. 8) described above as seen in an energy band diagram of FIG. 9, that is, to set the band gap mentioned so as to be smaller than the band gap of the barrier layer made from an AlGaInAs-based material.

Figure 10:
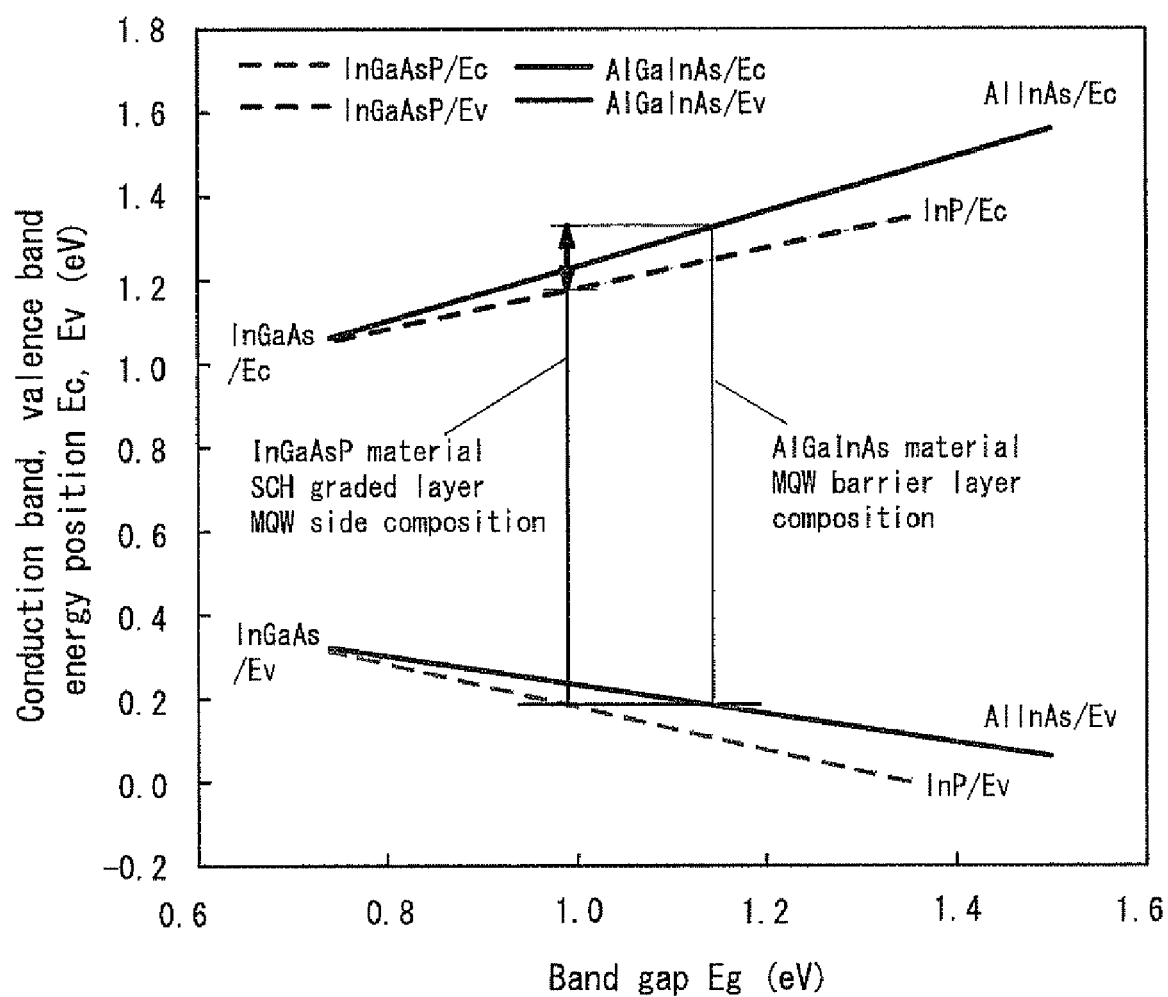
FIG. 10 is a diagram illustrating variation of the energy position Ec of the conduction band minimum and the energy position Ev of the valence band maximum of an InGaAsP-based material and an AlGaInAs-based material with respect to the band gap Eg and is a view illustrating a further subject to be solved by the embodiment.

In other words, it is a possible idea to set, in order to eliminate band discontinuity on the p-side valence band, the composition on the side of the p-side SCH graded layer made from an InGaAsP-based material on whose side it contacts with the barrier layer such that the energy position Ev of the valence band maximum on the side of the p-side SCH graded layer made from an InGaAsP-based material on whose side it contacts with the barrier layer becomes equal to the energy position Ev of the valence band maximum of the barrier layer made from an AlGaInAs-based material, for example, as seen in FIG. 10.

Figure 9:
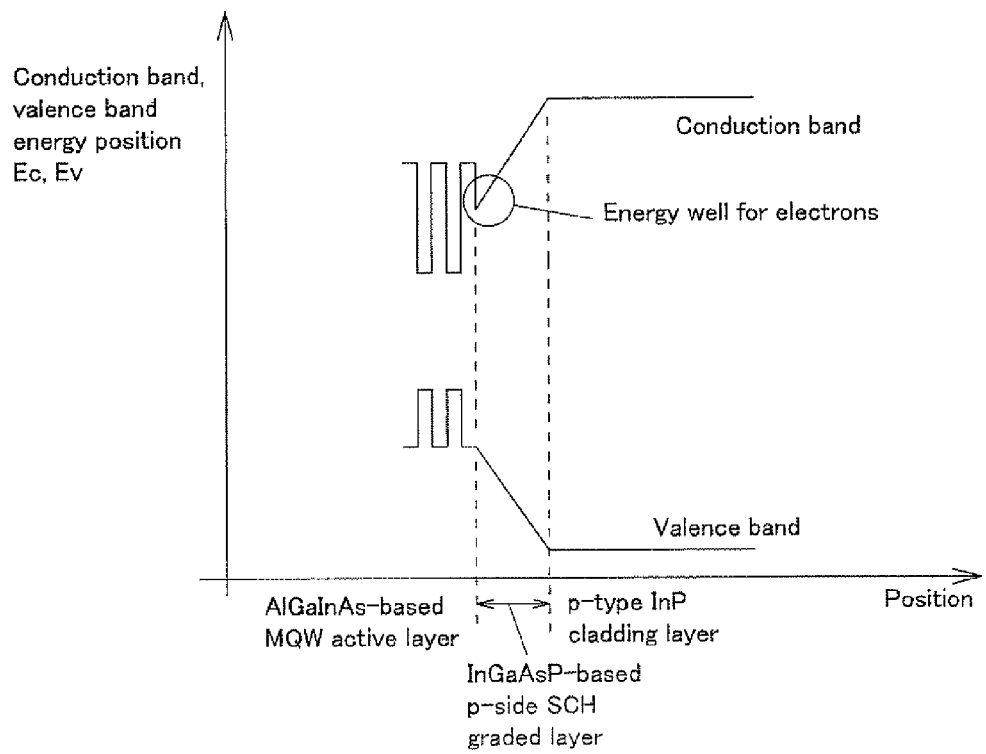

However, if the composition on the side of the p-side SCH graded layer made from an InGaAsP-based material on whose side it contacts with the barrier layer is set in this manner, then the difference between the energy positions Ec of the conduction band minimum increases at the barrier layer made from an AlGaInAs-based material and the side of the p-side SCH graded layer made from an InGaAsP-based material on whose side it contacts with the barrier layer as seen in FIG. 10, and a potential well for electrons is formed at the portion at which the p-side SCH graded layer and the barrier layer contact with each other as shown in FIG. 9. As a result, the electrons are trapped in the potential well and this phenomenon makes a problem when it is tried to implement high-speed operation of the modulator.

Also it is studied to use, where it is tried to connect the InGaAsP-based SCH graded layer and the AlGaInAs-based MQW active layer, which are made from materials of material systems different from each other, to each other as described above, an AlGaInAs-based material same as that used for the MQW active layer similarly for the p-side SCH graded layer in order to cancel band discontinuity to appear on the interface between the layers.

Figure 11:
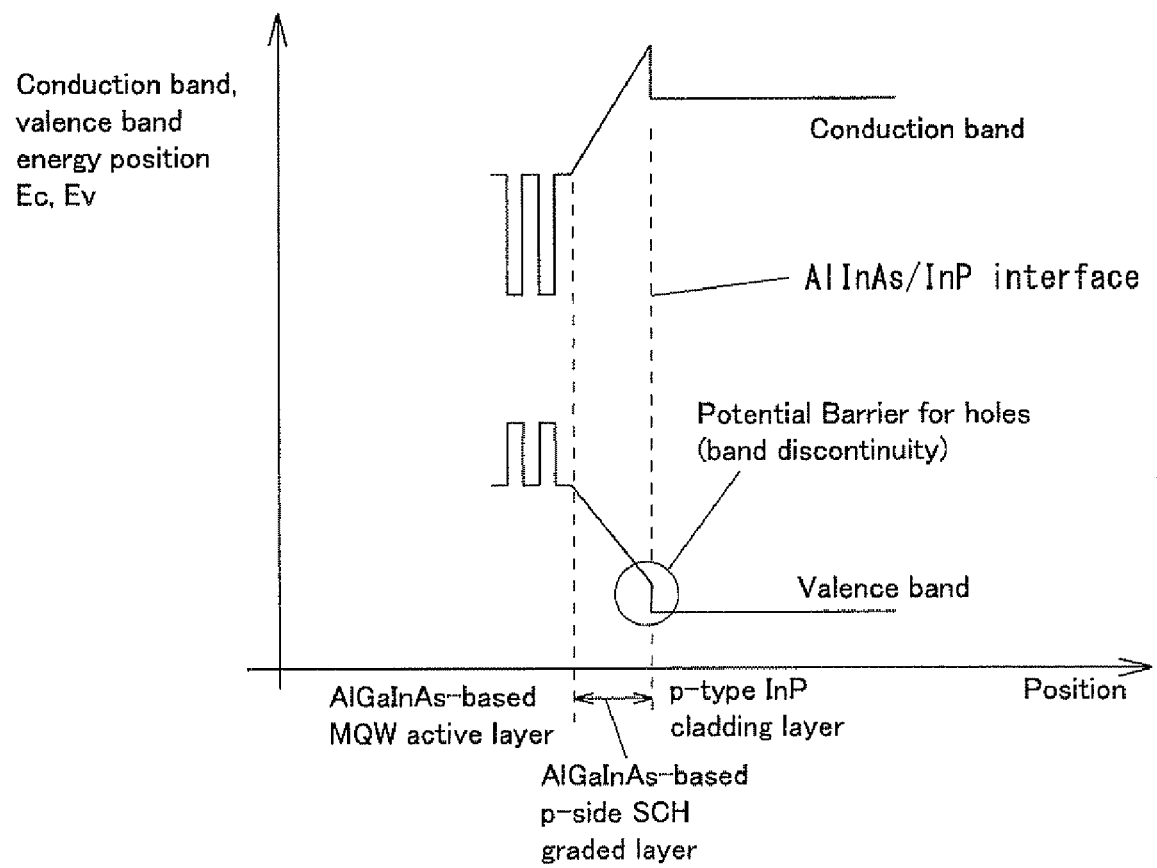
FIG. 11 is an energy band diagram illustrating a different subject to be solved by the embodiment.

If an AlGaInAs-based material is used for the p-side SCH graded layer similarly to the MQW active layer in this manner, then band discontinuity does not appear on any one of the conduction band and the valence band and the barrier layer of the MQW active layer and the p-side SCH graded layer are connected to each other smoothly as seen in FIG. 11.

However, in this instance, if notice is taken of the interface between the p-side SCH graded layer and the p-type InP cladding layer, then it is recognized that band discontinuity which acts as an energy barrier (potential barrier) for holes appears on the valence band as seen in FIG. 11.

Accordingly, even if an AlGaInAs-based material is used for the p-side SCH graded layer, high-speed movement of holes to the p-side electrode is blocked in the interface between the p-side SCH graded layer and the p-type InP cladding layer, and as a result, this phenomenon makes a problem when it is tried to implement high-speed operation of the modulator.

If the composition on the side of the p-side SCH graded layer made from an AlGaInAs-based material on whose side it contacts with the p-type InP cladding layer can be selected such that the band gap on the side of the p-side SCH graded layer made of an AlGaInAs-based material on whose side it contacts with the p-type InP cladding layer becomes larger than that shown in FIG. 11, then band discontinuity on the valence band appearing in the interface with the p-type InP cladding layer can be eliminated. However, actually, even if the composition of the AlGaInAs-based p-side SCH graded layer is set such that the band gap becomes maximum, that is, even if AlInAs is used for the p-side SCH graded layer, the energy position Ev of the valence band maximum does not coincide with that of the p-type InP cladding layer. Therefore, it is impossible to completely eliminate band discontinuity on the valence band.

If it is tried to connect two layers made from different materials of the two material systems, that is, an AlGaInAs-based MQW active layer and a p-type cladding layer (p-type InP cladding layer) made from an InGaAsP-based material, to each other using a p-side SCH graded layer made from a material of one of the material systems in this manner, then it is impossible to simultaneously cancel both of the band discontinuity on the valence band and the potential well on the conduction band whatever countermeasure is applied.

It is to be noted here that, while the subjects described above relate to an electro-absorption modulator, also active devices such as a laser diode and a photodetector which have a configuration similar to that of the electro-absorption modulator described above have similar subjects.

In the following, semiconductor devices according to embodiments are described with reference to the drawings.

First Embodiment

First, a semiconductor device according to a first embodiment is described with reference to FIGS. 1 and 2.

The semiconductor device is suitable for use with an active device such as, for example, an electro-absorption modulator, a laser diode, a photodetector or the like, which composes an optical module in an optical communication system.

The semiconductor device according to the present embodiment is an electro-absorption modulator including an MQW active layer made from, for example, an AlGaInAs-based semiconductor material, and a semi-insulating buried hetero-structure (SI-BH structure) is applied as a current blocking structure.

In particular, for example, as shown in FIG. 1, the present electro-absorption modulator includes an n-type InP substrate 1, an n-type InP cladding layer 2, an n-side SCH graded layer (n-side optical guide layer) 3 made from an InGaAsP-based semiconductor material, an undoped multiple quantum well active layer (MQW active layer) 4 made from an AlGaInAs-based semiconductor layer, a p-side SCH graded layer (p-side first optical guide layer) 5 made from an AlGaInAs-based semiconductor material, a p-side SCH graded layer (p-side second optical guide layer) 6 made from an InGaAsP-based semiconductor material, a p-side cladding layer (here, p-side InP cladding layer) 7 made from an InGaAsP-based semiconductor material, a high-resistance InP burying layer (semi-insulating InP burying layer) 8, a p-side electrode (metal electrode) 9, and an n-side electrode (metal electrode) 10. The configuration elements 2 to 10 are provided on the n-type InP substrate 1.

In this manner, in the present embodiment, a two-layer structure SCH layer wherein the first graded layer 5 made from an AlGaInAs-based semiconductor material and the second graded layer 6 made from an InGaAsP-based semiconductor material are stacked in order is provided between the MQW active layer 4 and the p-side cladding layer 7.

It is to be noted here that, while a p-type cladding layer having the p-type conductivity is applied as the p-side cladding layer 7, the present invention is not limited to this, and an undoped cladding layer may be applied. In this instance, a p-type cladding layer is provided just above an undoped cladding layer.

In the present electro-absorption modulator, for example, as illustrated in FIG. 1, a mesa structure including the MQW active layer 4, SCH graded layers 3, 5 and 6 and cladding layers 2 and 7 is formed and the high-resistance InP burying layer 8 is formed such that the mesa structure is buried therein. Then, the n-side electrode 10 is provided on the back face side of the n-type InP substrate 1, and the p-side electrode 9 is provided on the p-side cladding layer 7.

In the present embodiment, the MQW active layer 4 is structured such that a barrier layer (first semiconductor layer) made from $Al_{x1}Ga_{y1}In_{1-x1-y1}As$ ($0 \leq x1 \leq 1$, $0 \leq y1 \leq 1$) and a well layer made from $Al_{x5}Ga_{y5}In_{1-x5-y5}As$ $0 \leq x5 \leq 1$, $0 \leq y5 \leq 1$) are stacked alternately.

Then, the AlGaInAs-based p-side SCH graded layer (second semiconductor layer) 5 made from $Al_{x2}Ga_{y2}In_{1-x2-y2}As$ ($0 \leq x2 \leq 1$, $0 \leq y2 \leq 1$) is formed just above the barrier layer of the MQW active layer 4 on the side nearest to the p-side electrode 9. Further, the InGaAsP-based p-side SCH graded layer (third semiconductor layer) 6 made from $In_{x3}Ga_{1-x3}As_{y3}P_{1-y3}$ ($0 \leq x3 \leq 1$, $0 \leq y3 \leq 1$) is formed just above the AlGaInAs-based p-side SCH graded layer 5. Further, the p-side cladding layer (fourth semiconductor layer) 7 made from $In_{x4}Ga_{1-x4}As_{y4}P_{1-y4}$ ($0 \leq x4 \leq 1$, $0 \leq y4 \leq 1$) is formed just on the InGaAsP-based p-side SCH graded layer 6. In particular, the barrier layer (first semiconductor layer), AlGaInAs-based p-side SCH graded layer (second semiconductor layer) 5, InGaAsP-based p-side SCH graded layer (third semiconductor layer) 6 and p-side cladding layer (fourth semiconductor layer) 7 are provided in order in a contacting relationship with each other over the InP substrate 1.

It is to be noted that, where an undoped cladding layer is applied as the p-side cladding layer 7, a p-type cladding layer made from $In_{x6}Ga_{1-x6}As_{y6}P_{1-y6}$ ($0 \leq x6 \leq 1$, $0 \leq y6 \leq 1$) is formed just above the undoped cladding layer.

Figure 2:
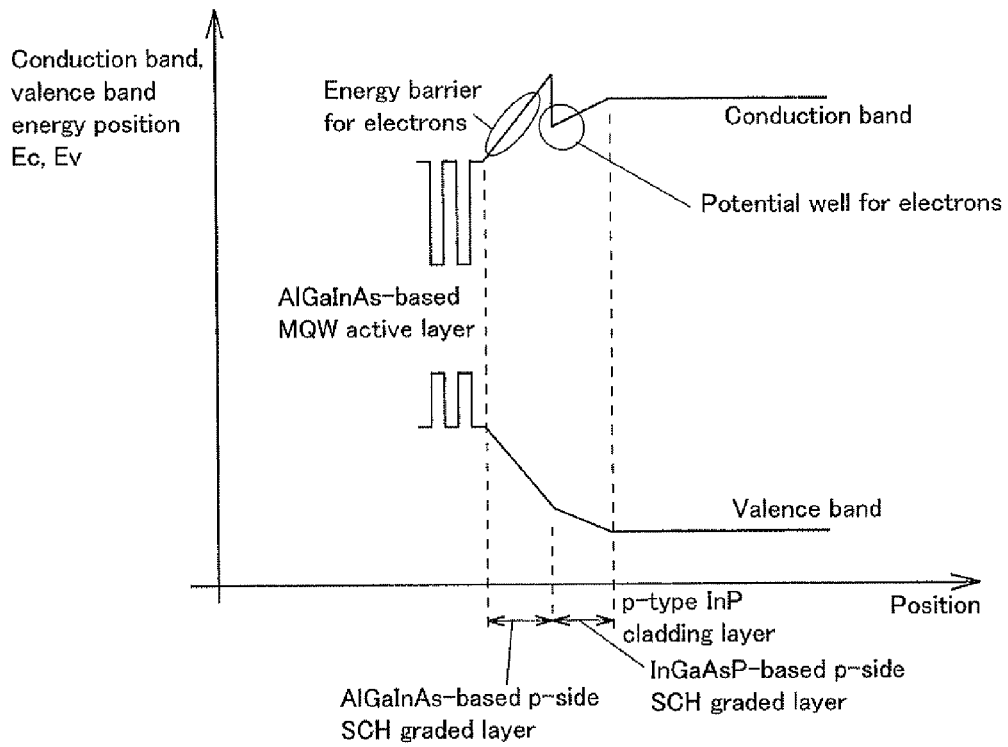
FIG. 2 is an energy band diagram of the semiconductor device according to the first embodiment.

Here, FIG. 2 illustrates an energy band diagram from the MQW active layer to p-side cladding layer (here, p-type InP cladding layer) of the present electro-absorption modulator.

First, as seen in FIG. 2, the compositions of the barrier layer (first semiconductor layer) of the AlGaInAs-based MQW active layer 4 on the side nearest to the p-side electrode 9 and the AlGaInAs-based p-side SCH graded layer (second semiconductor layer) 5 are same as or substantially same as each other on the interface on which the first and second semiconductor layers contact with each other.

Then, as seen in FIG. 2, the composition of the AlGaInAs-based p-side SCH graded layer (second semiconductor layer) 5 continuously varies such that the band gap continuously increases from the side of the barrier layer (first semiconductor layer) toward the side of the InGaAsP-based p-side SCH graded layer (third semiconductor layer) 6.

The AlGaInAs-based p-side SCH graded layer (second semiconductor layer) 5 on the side of the InGaAsP-based p-side SCH graded layer (third semiconductor layer) 6 is configured as an AlGaInAs-based layer having a large band gap or an AlInAs-based layer which does not contain Ga such that, for example, the band gap of the AlGaInAs-based p-side SCH graded layer (second semiconductor layer) 5 increases on the side of the InGaAsP-based p-side SCH graded layer (third semiconductor layer) 6 in comparison with the side of the barrier layer (first semiconductor layer).

Further, as seen in FIG. 2, the compositions of the AlGaInAs-based p-side SCH graded layer (second semiconductor layer) 5 and the InGaAsP-based p-side SCH graded layer (third semiconductor layer) 6 are set such that the energy levels Ev of the valence band maximum are equal to each other on the interface on which the layers 5 and 6 contact with each other.

Further, as seen in FIG. 2, the composition of the InGaAsP-based p-side SCH graded layer (third semiconductor layer) 6 continuously varies such that the band gap continuously increases from the side of the AlGaInAs-based p-side SCH graded layer (second semiconductor layer) 5 toward the side of the p-side cladding layer (fourth semiconductor layer) 7.

Furthermore, as seen in FIG. 2, the compositions of the InGaAsP-based p-side SCH graded layer (third semiconductor layer) 6 and the p-side cladding layer (fourth semiconductor layer) 7 are same as or substantially same as each other on the interface on which the layers 6 and 7 contact with each other. Here, since a p-side InP cladding layer is applied as the p-side cladding layer 7, the composition of the InGaAsP-based p-side SCH graded layer (p-side second optical guide layer) 6 is InP on the interface on which the InGaAsP-based p-side SCH graded layer 6 and the p-side InP cladding layer 7 contact with each other.

In this manner, the present electro-absorption modulator does not have any band discontinuity which acts as an energy barrier for holes on the valence band between the MQW active layer 4 and the p-side cladding layer 7 (here, p-type InP cladding layer). Therefore, in the present electro-absorption modulator, holes generated by absorption of light into the MQW active layer 4 can move at a high speed to the p-side electrode 9, and as a result, high-speed operation of the modulator is implemented.

On the other hand, as seen in FIG. 2, a potential well for electrons is formed at a portion of the conduction band at which the AlGaInAs-based p-side SCH graded layer 5 and the InGaAsP-based p-side SCH graded layer 6 contact with each other.

However, since a potential barrier by the AlGaInAs-based p-side SCH graded layer 5 is formed between the portion just described and the barrier layer which composes the MQW active layer 4, such a situation that electrons generated in the MQW active layer 4 pass the potential barrier until they reach and are accumulated in the potential well does not occur. In other words, an effective potential well for electrons is not formed. Therefore, the electrons generated by absorption of light in the MQW active layer 4 can move at a high speed to the n-side electrode, and as a result, high-speed operation of the modulator is implemented.

Accordingly, with the semiconductor device (electro-absorption modulator) according to the present embodiment, there is an advantage that it can achieve a good device characteristic even if a configuration wherein the layer 4 made from an AlGaInAs-based material and the layer 7 made from an InGaAsP-based material are connected to each other is provided.

In particular, by using an AlGaInAs-based semiconductor material for the MQW active layer 4, a device performance (for example, an extinction ratio, a temperature characteristic or the like) can be improved. More particularly, by using an AlGaInAs-based semiconductor material for the MQW active layer 4, a high ratio (band offset ratio; $\Delta Ec/\Delta Ev$) of the conduction band offset value $\Delta Ec$ between the well layer and the barrier layer to the valence band offset value $\Delta Ev$ can be obtained, and, in comparison with a conventional modulator in which an InGaAsP-based MQW active layer 4 is used, a modulation characteristic can be improved and a good characteristic is obtained.

Further, in the present embodiment, where the MQW active layer 4 made from an AlGaInAs-based material and the p-side cladding layer (here, p-type InP cladding layer) 7 made from an InGaAsP-based material are connected to each other, the layers between the AlGaInAs-based MQW active layer 4 and the InGaAsP-based p-side cladding layer (here, p-type InP cladding layer) 7 have no band discontinuity on the valence band and no effective potential well on the conduction band. Therefore, there is an advantage that holes and electrons generated by light absorption into the MQW active layer 4 can move at a high speed to the p-side electrode 9 and the n-side electrode 10, respectively, and as a result, enhancement of performances such as high-speed operation, high-speed response characteristic and so forth can be implemented.

Second Embodiment

Now, a semiconductor device according to a second embodiment is described.

The semiconductor device (electro-absorption modulator) according to the present embodiment is a particular example of a configuration of the electro-absorption modulator in the first embodiment described above, and is characterized in that the composition of the AlGaInAs-based p-side SCH graded layer (second semiconductor layer) on the interface on which the AlGaInAs-based p-side SCH graded layer (second semiconductor layer) and the InGaAsP-based p-side SCH graded layer (third semiconductor layer) contact with each other is AlInAs which lattice matches with InP. It is to be noted that the basic configuration is same as that in the first embodiment described above.

Here, Table 1 given below indicates a layer structure, a band gap of each layer, a film thickness, a dopant and a doping density of the electro-absorption type modulator according to the present embodiment.

TABLE 1

| Layer | | Band Gap | Film Thickness (nm) | Dopant | Doping Density (/cm3) |
|---|---|---|---|---|---|
| p-type InP cladding layer | | 1.35 eV | 1.50 μm | Zn | 1.50E+17 |
| Undoped InP cladding layer | | 1.35 eV | 50 nm | Undoped | — |
| InGaAsP-based p-side SCH graded layer | Terminal end Start | 1.35 eV (InP) 1.23 eV (InGaAsP) | 30 nm | Undoped | — |
| AlGaInA-based p-side SCH graded layer | Terminal end Start | 1.50 eV (AlInAs) 1.03 eV (AlGaInAs) | 30 nm | Undoped | — |
| AlGaInAs-based MQW active layer (8 wells) | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| InGaAsP-based n-side SCH graded layer | Terminal end Start | 1.03 eV (InGaAsP) 1.35 eV (InP) | 60 nm | Undoped | — |
| n-type InP cladding layer | | 1.35 eV | 500 nm | Si | 1.00E+18 |
| n-type InP substrate | | 1.35 eV | 300 μm | Sn | 1.00E+18 |

As seen in Table 1, the present electro-absorption modulator is structured such that an n-type InP cladding layer, an InGaAsP-based n-side SCH graded layer, an AlGaInAs-based undoped MQW active layer (first semiconductor layer), an AlGaInAs-based p-side SCH graded layer (second semiconductor layer), an InGaAsP-based p-side SCH graded layer (third semiconductor layer), an undoped InP cladding layer (fourth semiconductor layer) and a p-type InP cladding layer (fourth semiconductor layer) are stacked in order on an n-type InP substrate. It is to be noted that, though not indicated in Table 1, an n-side electrode (metal electrode) is provided on the back face side of the n-type InP substrate and a p-side electrode (metal electrode) is provided on the surface of a p-side cladding layer.

In the present embodiment, as seen in Table 1, the thickness of the InGaAsP-based n-side SCH graded layer formed on the n-type InP cladding layer is 60 nm and the n-side SCH graded layer is undoped. Further, the composition of the InGaAsP-based n-side SCH graded layer is InP on the side on which it contacts with the n-type InP substrate, but is set to a composition (InGaAsP), whose band gap (1.03 eV) is same as that of a barrier layer which composes the MQW active layer, on the side opposite to the side just described on which the InGaAsP-based n-side SCH graded layer contacts with the MQW active layer.

As seen in Table 1, the barrier layer which composes the MQW active layer is made from an AlGaInAs-based material and has the composition (AlGaInAs) whose band gap is 1.03 eV.

As seen in Table 1, a well layer which composes the MQW active layer is made from an AlGaInAs-based material same as that of the barrier layer and the composition thereof is determined such that the absorption edge wavelength of the MQW active layer becomes 1.49 μm, and a band gap of the well layer is a value of 0.83 eV or less. The absorption edge wavelength of the MQW active layer is set in this manner so that the present modulator is used for inputting light of 1.55 μm.

In the present embodiment, as seen in Table 1, the thickness of the barrier layer and the well layer is 7 nm, and totaling eight well layers are provided. Further, the MQW active layer is undoped.

As seen in Table 1, the AlGaInAs-based p-side SCH graded layer is formed on the MQW active layer. The AlGaInAs-based p-side SCH graded layer has a thickness of 30 nm and is undoped. Further, the composition of the AlGaInAs-based p-side SCH graded layer is set to a composition (AlGaInAs), whose band gap (1.03 eV) is same as that of the barrier layer, on the side on which the AlGaInAs-based p-side SCH graded layer contacts with the barrier layer which composes the MQW active layer, but is set to another composition (AlInAs), whose band gap is 1.50 eV, on the side opposite to the side just described on which the AlGaInAs-based p-side SCH graded layer contacts with the InGaAsP-based p-side SCH graded layer.

As seen in Table 1, the InGaAsP-based p-side SCH graded layer is formed on the AlGaInAs-based p-side SCH graded layer. The InGaAsP-based p-side SCH graded layer has the thickness of 30 nm and is undoped. Further, the composition of the InGaAsP-based p-side SCH graded layer is set to a composition (InGaAsP), whose band gap is 1.23 eV, on the side on which it contacts with the AlGaInAs-based p-side SCH graded layer, but is InP on the side opposite to the side just described on which the InGaAsP-based p-side SCH graded layer contacts with the p-type InP cladding layer.

As seen in Table 1, the undoped InP cladding layer and the p-type InP cladding layer are formed in order on the InGaAsP-based p-side SCH graded layer. The thickness of the undoped InP cladding layer and the thickness of the p-type InP cladding layer are 50 nm and 1.5 μm, respectively.

An energy band diagram of the layers from the MQW active layer to the p-side cladding layer (here, p-type InP cladding layer) of the present electro-absorption modulator having such a layer structure as described above is illustrated in FIG. 3.

Figure 3:
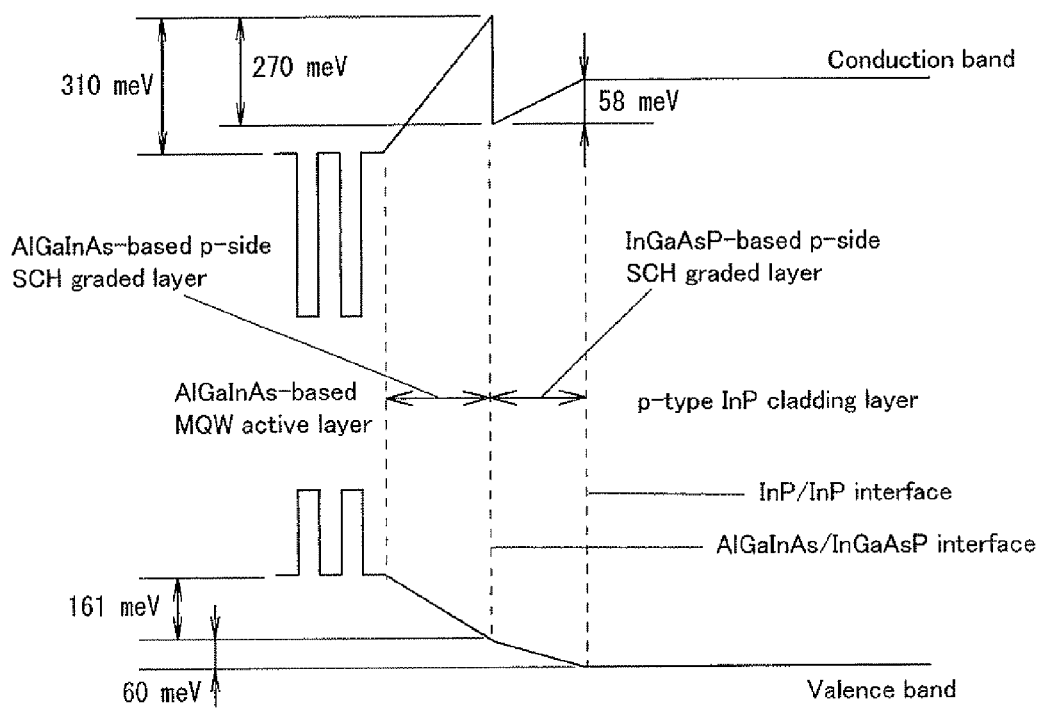
FIG. 3 is an energy band diagram of a semiconductor device according to a second embodiment.

As seen in FIG. 3, it is recognized that the present electro-absorption modulator do not have any band discontinuity which acts as an energy barrier for holes on the valence band between the barrier layer of the MQW active layer nearest to the p-side and the p-type InP cladding layer. Therefore, holes generated by light absorption into the MQW active layer can move at a high speed to the p-side electrode, and such a situation that holes are accumulated between the MQW active layer and the p-type InP cladding layer does not occur.

On the other hand, if notice is taken of the conduction band, then an energy barrier having a height of 310 meV by the AlGaInAs-based p-side SCH graded layer is formed between the barrier layer of the MQW active layer nearest to the p-side and the InGaAsP-based p-side SCH graded layer. Since the energy barrier having such a height as just described is formed, such a situation that electrons generated by light absorption into the MQW active layer pass the energy barrier until they are trapped into and accumulated in the potential well formed on the interface between the AlGaInAs-based p-side SCH graded layer and the InGaAsP-based p-side SCH graded layer does not occur.

Accordingly, with the semiconductor device (electro-absorption modulator) according to the present embodiment, similarly as in the semiconductor device according to the first embodiment described above, there is an advantage that a good device characteristic can be achieved even if the semiconductor device is configured such that a layer made from an AlGaInAs-based material and another layer made from an InGaAsP-based material are connected to each other.

In particular, by using an AlGaInAs-based semiconductor material for the MQW active layer, a device performance (for example, an extinction ratio, a temperature characteristic or the like) can be enhanced. More particularly, by using an AlGaInAs-based semiconductor material for the MQW active layer, a high ratio (band offset ratio; ΔEc/ΔEv) of the conduction band offset value ΔEc between the well layer and the barrier layer with respect to the valence band offset value ΔEv can be achieved, and, in comparison with a conventional modulator for which an InGaAsP-based MQW active layer is used, a modulation characteristic can be improved and a good characteristic can be obtained.

Further, where the MQW active layer made from an AlGaInAs-based material and the p-side cladding layer (here, p-type InP cladding layer) made from an InGaAsP-based material are connected to each other, the layers between the AlGaInAs-based MQW active layer and the InGaAsP-based p-side cladding layer (here, p-type InP cladding layer) have no band discontinuity on the valence band and no effective potential well on the conduction band. Therefore, there is an advantage that carriers such as holes and electrons generated by light absorption into the MQW active layer can move at a high speed to the p-side electrode and the n-side electrode, respectively, and as a result, enhancement of performances such as high-speed operation, high-speed response characteristic and so forth can be implemented.

Third Embodiment

Now, a semiconductor device according to a third embodiment is described.

In the semiconductor device (electro-absorption modulator) according to the present embodiment, the thickness and the composition of the AlGaInAs-based p-side SCH graded layer (second semiconductor layer) and the InGaAsP-based p-side SCH graded layer (third semiconductor layer) are different from those in the second embodiment described above.

Here, Table 2 given below indicates a layer structure, a band gap of each layer, a film thickness, a dopant and a doping density of the electro-absorption type modulator according to the present embodiment.

TABLE 2

| Layer | | Band Gap | Film Thinckness (nm) | Dopant | Doping Density (/cm3) |
|---|---|---|---|---|---|
| p-type InP cladding layer | | 1.35 eV | 1.50 μm | Zn | 1.50E+17 |
| Undoped InP cladding layer | | 1.35 eV | 50 nm | Undoped | — |
| InGaAsP-based p-side SCH graded layer | Terminal end | 1.35 eV (InP) | 40 nm | Undoped | — |
| | Start | 0.97 eV (InGaAsP) | | | |
| AlGaInAs-based p-side SCH graded layer | Terminal end | 1.11 eV (AlGaInAs) | 20 nm | Undoped | — |
| | Start | 1.03 eV (AlGaInAs) | | | |
| AlGaInAs-based MQW active layer (8 wells) | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |
| | Well layer | <0.83 eV (AlGaInAs) | 7 nm | Undoped | — |
| | Barrier layer | 1.03 eV (AlGaInAs) | 7 nm | Undoped | — |

TABLE 2-continued

| Layer | | Band Gap | Film Thinckness (nm) | Dopant | Doping Density (/cm3) |
|---|---|---|---|---|---|
| InGaAsP-based n-side SCH graded layer | Terminal end Start | 1.03 eV (InGaAsP) 1.35 eV (InP) | 60 nm | Undoped | — |
| n-type InP cladding layer | | 1.35 eV | 500 nm | Si | 1.00E+18 |
| n-type InP substrate | | 1.35 eV | 300 μm | Sn | 1.00E+18 |

In the present embodiment, as seen in Table 2, the thickness of the AlGaInAs-based p-side SCH graded layer formed on the MQW active layer is 20 nm and the AlGaInAs-based p-side SCH graded layer is undoped. Further, the composition of the AlGaInAs-based p-side SCH graded layer is set to a composition (AlGaInAs), whose band gap (1.03 eV) is same as that of the barrier layer, on the side on which the AlGaInAs-based p-side SCH graded layer contacts with the barrier layer which composes the MQW active layer. Further, the composition of the AlGaInAs-based p-side SCH graded layer is set to a composition (AlGaInAs), whose band gap is 1.11 eV, on the side opposite to the side described above on which the AlGaInAs-based p-side SCH graded layer contacts with the InGaAsP-based p-side SCH graded layer.

In this manner, the AlGaInAs-based p-side SCH graded layer has the composition containing Ga element on the side on which it contacts with the InGaAsP-based p-side SCH graded layer, and, in this composition, the ratio of Al element is low in comparison with the composition (AlInAs) in the second embodiment described above. Since generally a device fabrication process for a structure including a layer made from an AlGaInAs-based semiconductor material (including AlInAs-based semiconductor material) wherein the ratio of Al element is high is difficult, there is an advantage that, by using AlGaInAs whose ratio of Al element is comparatively low for the AlGaInAs-based p-side SCH graded layer as in the present embodiment, device production can be carried out easily.

On the other hand, if the composition wherein the ratio of Al element is low is applied in this manner, then the height of an energy barrier by the AlGaInAs-based p-side SCH graded layer is reduced as hereinafter described. In this instance, the ratio of Al element in the AlGaInAs-based p-side SCH graded layer (second semiconductor layer) on the first side on which the second semiconductor layer contacts with the InGaAsP-based p-side SCH graded layer (third semiconductor layer) may be set such that the energy level of the conduction band minimum on the first side on which the second semiconductor layer contacts with the InGaAsP-based p-side SCH graded layer (third semiconductor layer) is higher by 20 to 100 meV than that on the second side on which the second semiconductor layer contacts with the barrier layer (first semiconductor layer).

As seen in Table 2, the InGaAsP-based p-side SCH graded layer is formed on the AlGaInAs-based p-side SCH graded layer. The InGaAsP-based p-side SCH graded layer has the thickness of 40 nm and is undoped. Further, the composition of the InGaAsP-based p-side SCH graded layer is set to a composition (InGaAsP), whose band gap is 0.97 eV, on the side on which the InGaAsP-based p-side SCH graded layer contacts with the AlGaInAs-based p-side SCH graded layer, but is InP on the side opposite to the side just described on which the InGaAsP-based p-side SCH graded layer contacts with the p-type InP cladding layer.

It is to be noted that, since the layer structure of the other part is same as that in the second embodiment described above, description of the layer structure of the other part is omitted herein to avoid redundancy.

The energy band diagram of the layers from the MQW active layer to the p-side cladding layer (here, p-type InP cladding layer) of the present electro-absorption modulator having such a layer structure as described above is illustrated in FIG. 4.

Figure 4:
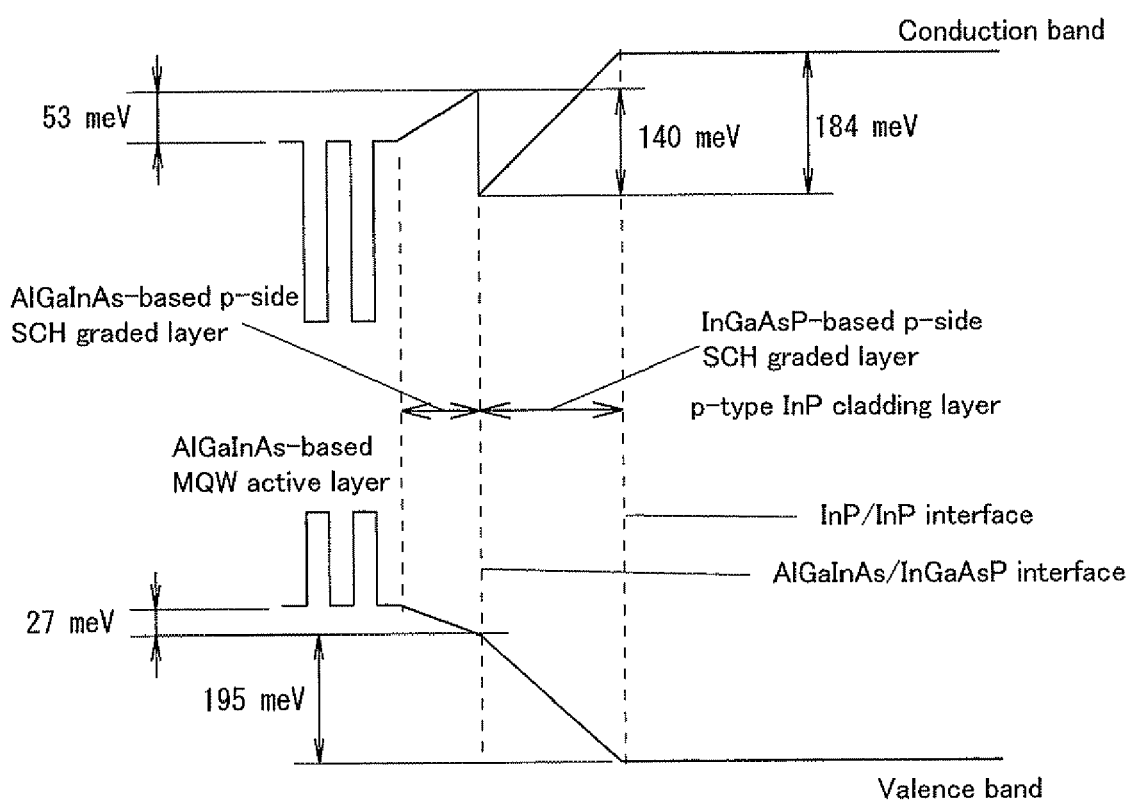
FIG. 4 is an energy band diagram of a semiconductor device according to a third embodiment.

As seen in FIG. 4, it can be recognized that, in the present electro-absorption modulator, the valence band in the layers between the barrier layer of the MQW active layer nearest to the p-side and the p-type InP cladding layer does not have any band discontinuity which acts as an energy barrier for holes. Therefore, holes generated by light absorption into the MQW active layer can move at a high speed to the p-side electrode, and such a situation that holes are accumulated between the MQW active layer and the p-type InP cladding layer does not occur.

On the other hand, if notice is taken of the conduction band, then an energy barrier having a height of 53 meV by the AlGaInAs-based p-side SCH graded layer is formed between the barrier layer of the MQW active layer nearest to the p-side and the InGaAsP-based p-side SCH graded layer. It is to be noted that, while the height of the energy barrier is lower than that in the second embodiment described above, if it is taken into consideration that the thermal excitation fluctuation $k_B T$ ($k_B$ indicates the Boltzmann constant, and T indicates the absolute temperature) at a room temperature is 25 meV, then the energy barrier can act as a sufficiently high energy barrier for electrons.

Therefore, such a situation that electrons generated by light absorption into the MQW active layer pass the energy barrier and are trapped into and accumulated in the potential well formed on the interface between the AlGaInAs-based p-side SCH graded layer and the InGaAsP-based p-side SCH graded layer does not occur.

Accordingly, with the semiconductor device (electro-absorption modulator) according to the present embodiment, similarly as in the semiconductor device according to the second embodiment described above, there is an advantage that a good device characteristic can be achieved even if the semiconductor device is configured such that a layer made from an AlGaInAs-based material and another layer made from an InGaAsP-based material are connected to each other.

In particular, by using an AlGaInAs-based semiconductor material for the MQW active layer, a device performance (for example, an extinction ratio, a temperature characteristic or the like) can be enhanced. More particularly, by using an AlGaInAs-based semiconductor material for the MQW active layer, a high ratio (band offset ratio; $\Delta E_c/\Delta E_v$) of the conduction band offset value $\Delta E_c$ between the well layer and the barrier layer to the valence band offset value $\Delta E_v$ can be obtained, and, in comparison with a conventional modulator for which an InGaAsP-based MQW active layer is used, the modulation characteristic can be improved and a good characteristic is obtained.

Further, in the present embodiment, where the MQW active layer made from an AlGaInAs-based material and the p-side cladding layer (here, p-type InP cladding layer) made from an InGaAsP-based material are connected to each other, the layers between the AlGaInAs-based MQW active layer and the InGaAsP-based p-side cladding layer (here, p-type InP cladding layer) have no band discontinuity on the valence band and no effective potential well on the conduction band. Therefore, there is an advantage that carriers such as holes and electrons generated by light absorption into the MQW active layer can move at a high speed to the p-side electrode and the n-side electrode, respectively, and as a result, enhancement of performances such as high-speed operation, high-speed response characteristic and so forth can be implemented.

Fourth Embodiment

Now, a semiconductor device according to a fourth embodiment is described.

The present embodiment is different from the embodiments described above wherein the present invention is applied to an electro-absorption modulator in that the present invention is applied to a laser diode. In other words, the semiconductor device according to the present embodiment is a laser diode including an MQW active layer, for example, made from an AlGaInAs-based semiconductor material, and adopts a semi-insulating burying hetero-structure (SI-BH structure) as a current blocking structure.

It is to be noted that basically the present laser diode may be configured so as to have a configuration similar to that of the electro-absorption modulator according to the embodiments described above. However, in order to set the light emission wavelength from the MQW active layer to 1.55 μm, a well layer having a composition whose band gap is smaller than those of the compositions in the second and third embodiments described above (for example, a composition whose band gap is 0.80 eV or less) is used for the MQW active layer. Consequently, the oscillation wavelength of the laser diode can be set to 1.55 μm.

Accordingly, with the semiconductor device (laser diode) according to the present embodiment, similarly as the embodiments described above, there is an advantage that a good device characteristic can be obtained even if it is configured such that a layer made from an AlGaInAs-based material and another layer made from an InGaAsP-based material are connected to each other.

In particular, by using an AlGaInAs-based semiconductor material for the MQW active layer, a device performance (for example, a temperature characteristic or the like) can be enhanced. More particularly, by using an AlGaInAs-based semiconductor material for the MQW active layer, a high ratio (band offset ratio; $\Delta Ec/\Delta Ev$) of the conduction band offset value $\Delta Ec$ between the well layer and the barrier layer to the valence band offset value $\Delta Ev$ can be obtained, and a laser characteristic at a high temperature can be improved and a good temperature characteristic can be achieved.

Further, in the present embodiment, where the MQW active layer made from an AlGaInAs-based material and the p-side cladding layer (here, p-type InP cladding layer) made from an InGaAsP-based material are connected to each other, the layers between the AlGaInAs-based MQW active layer and the InGaAsP-based p-side cladding layer (here, p-type InP cladding layer) have no band discontinuity on the valence band. Generally, a notch, a spike or the like is formed on an interface on which band discontinuity exists, and causes increase of the device resistance. Further, in order to achieve a good device characteristic, generally it is preferable to configure a laser diode such that it has low device resistance. Accordingly, in such a laser diode having the structure which has no band discontinuity as in the present embodiment, the device resistance is decreased and a good device characteristic is obtained.

On the other hand, an energy barrier is formed on the conduction band and no effective potential well exists on the conduction band. Therefore, such a situation that electrons (carriers) injected into the MQW active layer overflow and are trapped can be prevented, and a good device characteristic is obtained.

[Others]

It is to be noted that, while the embodiments described above are described taking the case wherein the present invention is applied to an electro-absorption modulator or a laser diode as an example, the present invention is not limited to this.

In the present invention, where a layer made from an AlGaInAs-based material and another layer made from an InGaAsP-based material (including InP) whose variations of the energy position Ec of the conduction band minimum and the energy position Ev of the valence band maximum with respect to the band gap Eg are different from each other are connected to each other, an AlGaInAs-based graded layer and an InGaAsP-based graded layer are inserted in order between the first-mentioned two layers and the composition of the layers is set suitably such that the two layers made from materials of the material systems different from each other are connected in a state wherein they have no band discontinuity on the valence band and no effective potential well for electrons on the conduction band.

Therefore, the present invention can be applied widely to semiconductor devices configured such that a layer made from an AlGaInAs-based material and another layer made from an InGaAsP-based material (including InP) whose variations of the energy position Ec of the conduction band minimum and the energy position Ev of the valence band maximum with respect to the band gap Eg are different from each other are connected to each other. For example, the present invention can be applied also to other devices such as a photodetector or the like.

Accordingly, the composition of the AlGaInAs-based material used for the MQW active layer and the composition of the InGaAsP-based material used for the p-side cladding layer are not limited to those in the embodiments described above.

Further, also the composition, thickness, doping density and so forth of the graded layers individually made from materials of both of the material systems including an AlGaInAs-based material and an InGaAsP-based material for connecting the layers just described to each other are not limited to those in the embodiments described above.

Further, while, in order to fully eliminate the band discontinuity on the valence band on the p side, the composition of the AlGaInAs-based p-side SCH graded layer (second semiconductor layer) and the InGaAsP-based p-side SCH graded layer (third semiconductor layer) in the embodiments described above is set such that the energy levels of the valence band maximum are substantially equal to each other on the interface on which the layers just described contact with each other, the present invention is not limited to this.

For example, even if some band discontinuity on the valence band remains (for example, a band offset of a few meV is generated), an effect similar to that of the present invention can be obtained. Therefore, the composition of the AlGaInAs-based p-side SCH graded layer (second semiconductor layer) and the InGaAsP-based p-side SCH graded layer (third semiconductor layer) may be set such that the energy levels of the valence band maximum are substantially equal to each other on the interface on which the layers just described contact with each other.

Further, while the embodiments described above are described taking the case wherein the present invention is applied to a semiconductor device including an AlGaInAs-based MQW active layer as an example, the present invention is not limited to this. The present invention can be applied, for example, also to a semiconductor device which includes an AlGaInAs-based bulk active layer (first semiconductor layer).

Further, while the embodiments described above are described taking the case wherein the present invention is applied to a semiconductor device formed on an n-type InP substrate as an example, the present invention is not limited to this. The present invention can be applied also to a semiconductor device formed on a p-type InP substrate.

All examples and conditional language recited herein are intended for pedagogical purposes to aid the reader in understanding the principles of the invention and the concepts contributed by the inventor to furthering the art, and are to be constructed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
an InP substrate;
a first semiconductor layer made from $Al_{x1}Ga_{y1}In_{1-x1-y1}As$ where $0 \leq x1 \leq 1$ and $0 \leq y1 \leq 1$;
a second semiconductor layer made from $Al_{x2}Ga_{y2}In_{1-x2-y2}As$ where $0 \leq x2 \leq 1$ and $0 \leq y2 \leq 1$;
a third semiconductor layer made from $In_{x3}Ga_{1-x3}As_{y3}P_{1-y3}$ where $0 \leq x3 \leq 1$ and $0 \leq y3 \leq 1$; and
a fourth semiconductor layer made from $In_{x4}Ga_{1-x4}As_{y4}P_{1-y4}$ where $0 \leq x4 \leq 1$ and $0 \leq y4 \leq 1$; and wherein
said first, second, third and fourth semiconductor layers are provided in order in a contacting relationship with each other over said InP substrate;
said first and second semiconductor layers have compositions which are same as or substantially same as each other on an interface therebetween;
the composition of said second semiconductor layer continuously varies such that a band gap continuously increases from the first semiconductor layer side toward the third semiconductor layer side;
the compositions of said second and third semiconductor layers are set such that energy levels of a valence band maximum are equal to or substantially equal to each other on an interface between said second and third semiconductor layers;
the composition of said third semiconductor layer continuously varies such that a band gap continuously increases from the second semiconductor layer side toward the fourth semiconductor layer side; and the compositions of said third and fourth semiconductor layers are same as or substantially same as each other on an interface between said third and fourth layers.

2. The semiconductor device as claimed in claim 1, wherein said first semiconductor layer is a barrier layer which composes a multiple quantum well active layer; and
further comprising a well layer which composes the multiple quantum well active layer, provided on the side opposite to the side of the barrier layer on whose side said second semiconductor layer is provided, the well layer being made from $Al_{x5}Ga_{y5}In_{1-x5-y5}As$ where $0 \leq x5 \leq 1$ and $0 \leq y5 \leq 1$.

3. The semiconductor device as claimed in claim 1, wherein said first semiconductor layer is a bulk active layer.

4. The semiconductor device as claimed in claim 2, wherein said second semiconductor layer is a p-side first optical guide layer;
said third semiconductor layer is a p-side second optical guide layer; and
said fourth semiconductor layer is a p-side cladding layer.

5. The semiconductor device as claimed in claim 4, wherein the p-side cladding layer is an undoped cladding layer; and
further comprising a p-type cladding layer provided on the side opposite to the side of the undoped cladding layer on whose side the p-side second optical guide layer is provided, the p-type cladding layer being made from $In_{x6}Ga_{1-x6}As_{y6}P_{1-y6}$ where $0 \leq x6 \leq 1$ and $0 \leq y6 \leq 1$.

6. The semiconductor device as claimed in claim 4, wherein the p-side cladding layer is a p-type cladding layer.

7. The semiconductor device as claimed in claim 1, wherein, on the interface on which said second and third semiconductor layers contact with each other, the composition of said second semiconductor layer is AlInAs which lattice matches with said InP substrate.

8. The semiconductor device as claimed in claim 1, wherein a ratio of Al element on a first side of said second semiconductor layer, the first side of which contacts with said third semiconductor layer, is set such that an energy level of a conduction band minimum on the first side of said second semiconductor layer is higher by 20 to 100 meV than that on a second side of said second semiconductor layer, the second side of which contacts with said first semiconductor layer.

9. The semiconductor device as claimed in claim 1, wherein said fourth semiconductor layer is a p-side InP layer; and
the composition of said third semiconductor layer is InP on the interface on which said third and fourth semiconductor layers contact with each other.

10. The semiconductor device as claimed in claim 1, wherein a metal electrode is provided on said fourth semiconductor layer.

11. An electro-absorption modulator, comprising:
the configuration as claimed in claim 1.

12. A laser diode, comprising:
the configuration as claimed in claim 1.

13. The semiconductor device as claimed in claim 3, wherein said second semiconductor layer is a p-side first optical guide layer;
said third semiconductor layer is a p-side second optical guide layer; and
said fourth semiconductor layer is a p-side cladding layer.

14. The semiconductor device as claimed in claim 13, wherein the p-side cladding layer is an undoped cladding layer; and
further comprising a p-type cladding layer provided on the side opposite to the side of the undoped cladding layer on whose side the p-side second optical guide layer is provided, the p-type cladding layer being made from $In_{x6}Ga_{1-x6}As_{y6}P_{1-y6}$ where $0 \leq x6 \leq 1$ and $0 \leq y6 \leq 1$.

15. The semiconductor device as claimed in claim 13, wherein the p-side cladding layer is a p-type cladding layer.

16. The semiconductor device as claimed in claim 2, wherein, on the interface on which said second and third semiconductor layers contact with each other, the composition of said second semiconductor layer is AlInAs which lattice matches with said InP substrate.

17. The semiconductor device as claimed in claim 3, wherein, on the interface on which said second and third semiconductor layers contact with each other, the composition of said second semiconductor layer is AlInAs which lattice matches with said InP substrate.

18. The semiconductor device as claimed in claim 2, wherein a ratio of Al element on a first side of said second semiconductor layer, the first side of which contacts with said third semiconductor layer, is set such that an energy level of a conduction band minimum on the first side of said second semiconductor layer is higher by 20 to 100 meV than that on a second side of said second semiconductor layer, the second side of which contacts with said first semiconductor layer.

19. The semiconductor device as claimed in claim 3, wherein a ratio of Al element on a first side of said second semiconductor layer, the first side of which contacts with said third semiconductor layer, is set such that an energy level of a conduction band minimum on the first side of said second semiconductor layer is higher by 20 to 100 meV than that on a second side of said second semiconductor layer, the second side of which contacts with said first semiconductor layer.

* * * * *